(12) United States Patent
Kröner

(10) Patent No.: US 6,255,190 B1
(45) Date of Patent: Jul. 3, 2001

(54) METHOD FOR DIELECTRICALLY ISOLATED DEEP PN-JUNCTIONS IN SILICON SUBSTRATES USING DEEP TRENCH SIDEWALL PREDEPOSITION TECHNOLOGY

(75) Inventor: Friedrich Kröner, Villach (AT)

(73) Assignee: Austria Mikro Systeme International AG, Unterpremstatten (AT)

(*) Notice: Subject to any disclaimer, the term of this patent is extended or adjusted under 35 U.S.C. 154(b) by 0 days.

(21) Appl. No.: 09/100,146

(22) Filed: Jun. 18, 1998

(30) Foreign Application Priority Data

Jun. 19, 1997 (AT) .............................. GM 378/97

(51) Int. Cl.$^7$ .................................................. H01L 21/76
(52) U.S. Cl. .................... 438/424; 438/433; 438/420; 438/554; 438/558; 438/561; 438/563
(58) Field of Search .................... 438/414, 433, 438/420, 554, 558, 561, 563, 424

(56) References Cited

U.S. PATENT DOCUMENTS

| | | | |
|---|---|---|---|
| 4,569,701 | * | 2/1986 | Oh . |
| 4,755,486 | * | 7/1988 | Treichel et al. . |
| 5,250,461 | | 10/1993 | Sparks ................................. 437/67 |
| 5,291,049 | | 3/1994 | Morita ................................. 257/335 |
| 5,354,710 | * | 10/1994 | Kawaguchi et al. ................. 430/146 |
| 5,843,825 | * | 12/1998 | Hwang ................................. 438/291 |
| 5,851,900 | * | 12/1998 | Chu et al. ............................ 438/434 |
| 5,913,132 | * | 6/1999 | Tsai ..................................... 438/434 |

FOREIGN PATENT DOCUMENTS

| | | | |
|---|---|---|---|
| 0288739 | 11/1988 | (EP) | .............. H01L/21/78 |
| 0256315 | 1/1992 | (EP) | .............. H01L/21/82 |
| 0221394 | 7/1992 | (EP) | .............. H01L/21/20 |
| 2206446 | 1/1989 | (GB) | .............. H01L/21/82 |

* cited by examiner

Primary Examiner—Trung Dang
(74) Attorney, Agent, or Firm—Wilson Sonsini Goodrich & Rosati

(57) ABSTRACT

A method for forming very deep pn-junctions without using epitaxy or extensively high temperature processing is provided.

At least two parallel deep trenches are etched into a silicon substrate. Then the sidewalls of these trenches are predeposited by dopants. After filling the deep trenches with insulating material, a diffusion process is done. This diffusion process performs in such a way that the formerly predeposited dopant is distributed rather uniformly in between the parallel deep trenches, e.g. is counterdoping the whole region with respect to the monocrystalline silicon substrate.

The said lateral trench doped region, which preferably is more deep than wide, serves either as drain or collector region of high voltage transistors or other high voltage devices. Also other devices like hall sensors, which gain advantages from the more deep than wide counterdoped regions, are possible.

19 Claims, 8 Drawing Sheets

METHOD FOR DIELECTRICALLY ISOLATED DEEP PN-JUNCTIONS IN SILICON SUBSTRATES USING DEEP TRENCH SIDEWALL PREDEPOSITION TECHNOLOGY

BACKGROUND OF THE INVENTION

This invention relates to produce dielectrically isolated, very deep pn-junctions in a silicon substrate without the use of epitaxy or extensive high temperature processing, but using deep trench sidewall predeposition technology. The principle of the invention consists in the formation of at least two parallel deep trenches and the rather uniform distribution of the doping material between said trenches by pre-depositing the sidewalls, filling the trenches with insulating material, and diffusing the predeposited dopants preferably simultaneous with the normal well diffusion of a CMOS process, in a manner that a subregion in the silicon substrate emerges, which pn-junction depth equals the trench depth plus the diffusion depths. That means that counterdoped regions which are more deep than wide are possible to be realized.

The invention relates to the integration of high voltage and preferably small signal transistors into integrated circuits (IC's) on monocrystalline silicon wafers.

The most widely spread method of isolating the individual transistors on the integrated circuit one to each other is the formation and use of negatively biased pn-junctions. On both sides of a negatively biased pn-junction a depletion layer, or space charge region of a certain thickness builds up. Within this layer the voltage drop between the two sides of the pn-junction occurs, and therefore an electric field exists, dependent on the voltage difference and the depletion layer width.

The higher the doping level on each side of the pn-junction is, the smaller is the depletion layer width, and, at a given voltage difference, the higher is the electric field. On contrary to that the critical electric field, i.e. the field where voltage breakdown due to avalanche multiplication occurs, is almost independent of the dopant concentration. Thus the higher the operating voltage of an IC, or a part of an IC is, the more space is needed in order to prevent breakthrough of the transistors in the off-state, and also, in the case that the transistor should be floating, to prevent breakthrough between the transistor and ist vicinity.

Conventional processing of regions counterdoped to a substrate, on an epitaxial layer or a former formed well implies predepositing the dopant atoms in concentrated phase at or near the surface and subsequently diffusing them with a high temperature process. Every such process implies that the lateral diffusion width is approximately but at least as wide as the diffusion width perpendicular to the wafer surface.

Reminding that there are two purposes of a high voltage pn-junction, namely first forming the channel-drain junction of a MOS transistor or forming the base-collector junction of a bipolar transistor etc., and second providing the device isolation it must be emphasized that the first purpose must be realized by a pn-junction, whereas for the second purpose alternatives exist.

SUMMARY OF THE INVENTION

After having stated these fundamental boundary conditions the scope of the invention can be explained to be the following:

In order to save space on the IC the claimed invention is a structure where the depletion layer width which serves as the active part of the transistor, i.e. the pn-junction where the main voltage drop during the off-state occurs, is placed in the direction perpendicular to the wafer surface and the purpose of the lateral transistor isolation is achieved with oxide filled trenches rather than pn-junctions, whereas the transistor isolation downwards to the substrate remains a junction. Since the critical electric field prior to breakdown in silicon is approximately 0.3 MV/cm and that in silicon dioxide is approx. 8 MV/cm, a lateral dielectric isolation of devices clearly is advantageous over junction isolation.

A similar concept is known in sparks, U.S. Pat. No. 5,250,461, but epitaxy equipment is necessary to realize what is claimed there:

What is claimed in this invention is a method to achieve the goal of transistor structures with active pn-junctions vertical to the surface and lateral dielectric isolation, thus a transistor structure which can lead to devices essentially more deep than wide, without the use of epitaxy machines and very high temperature furnaces.

DESCRIPTION OF THE PREFERRED EMBODIMENTS

Figure 1:
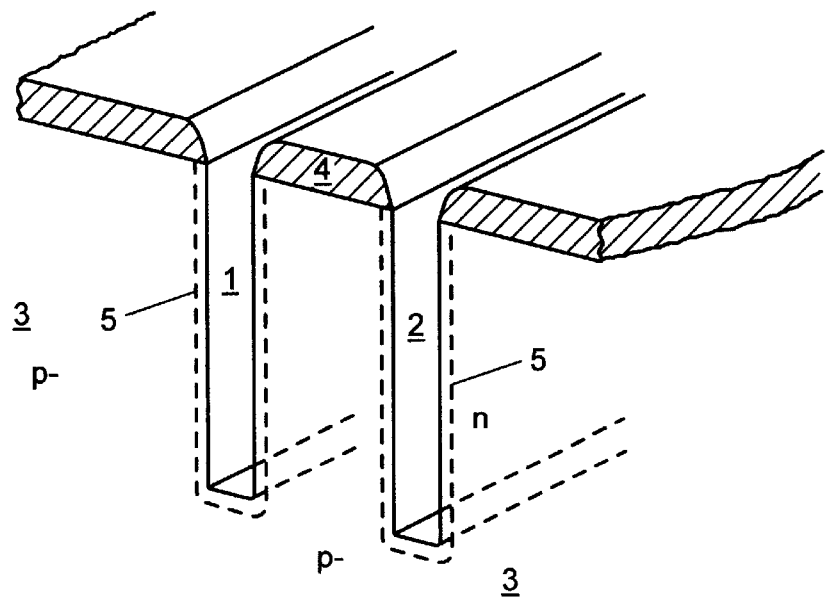
FIG. 1 shows basic aspects of the preferred embodiment of the invention.

Illustrated by the figures the principle and some examples of applications of the invention is explained in what follows. The principle is demonstrated in FIGS. 1 and 2.

Given a low p-type silicon substrate 3, on its surface a hardmask 4 is patterned and used to etch at least two neighboring, preferably parallel deep trenches 1 and 2. The next process step is the predeposition 5 of dopant material or dopant atoms onto the vertical walls, or directly underneath of them, of the deep trenches. The bottom of the deep trenches of course also is predeposited, but it must be avoided to predeposit at least that part of the surface of the silicon wafer which is not between the said at least two trenches.

Figure 2:
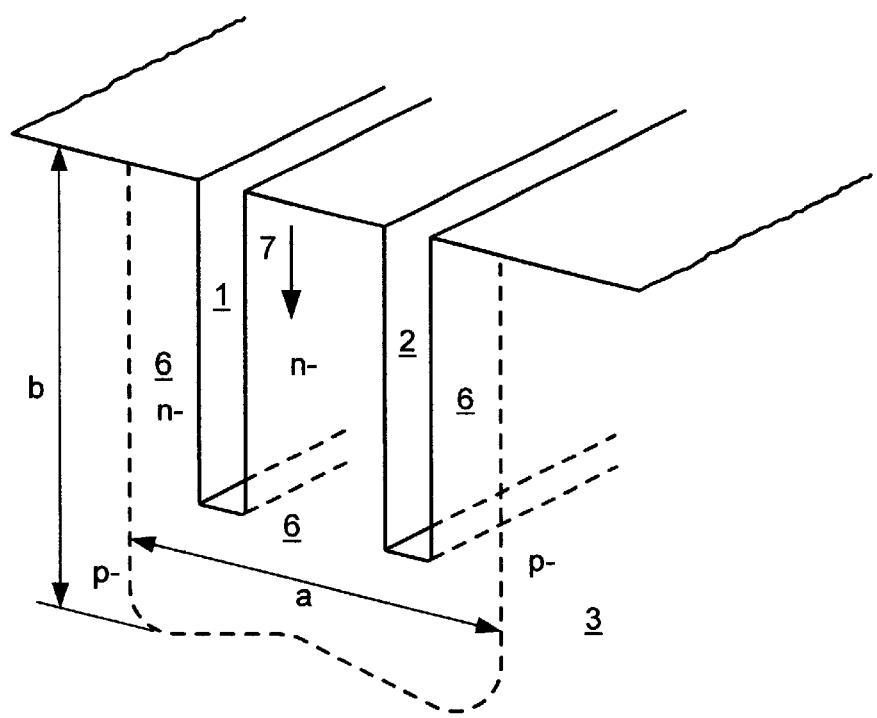
FIG. 2 also shows basic aspects of the preferred embodiment of the invention.

After performing a furnace diffusion with a thermal budget typical for a well diffusion of a CMOS-process, the dopant distributes laterally as indicated in FIG. 2 at a distance 6.

Therefore it is necessary to place the two parallel trenches 1 and 2 in such a distance that the whole region in between them is rather uniformly doped by the predeposited 5 dopant atoms. Dependent on the depth of the trenches therefore a structure is possible where the vertical distance b is larger than the lateral width a.

Figure 3:
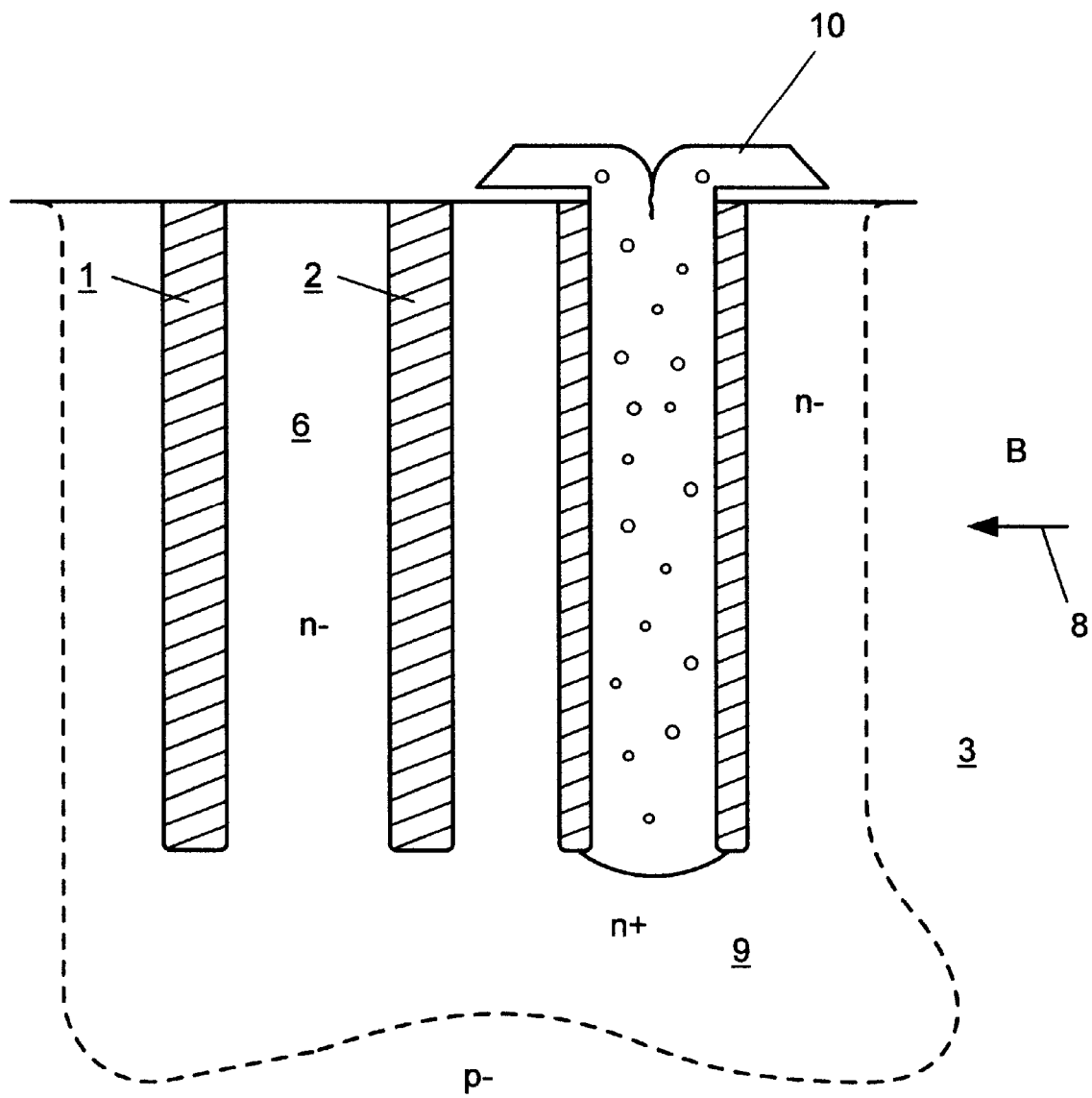
FIG. 3 illustrates a method of realizing a deep contact.

FIG. 3 demonstrates the choice of realizing a deep contact. If one additional deep trench is wider than the other trenches, the bottom can be opened by reactive ion etch, and a heavily doped polysilicon layer 10 or another conductive layer can be deposited in order to establish an electrical contact at the bottom 9 of the said wider deep trench. If the trenches extend a certain distance perpendicular to the plane of the drawing, an n-type sheath in a p-type surrounding can be established and used to realize a Hall sensor for magnetic fields 8 which are parallel to the wafer surface.

Figure 4:
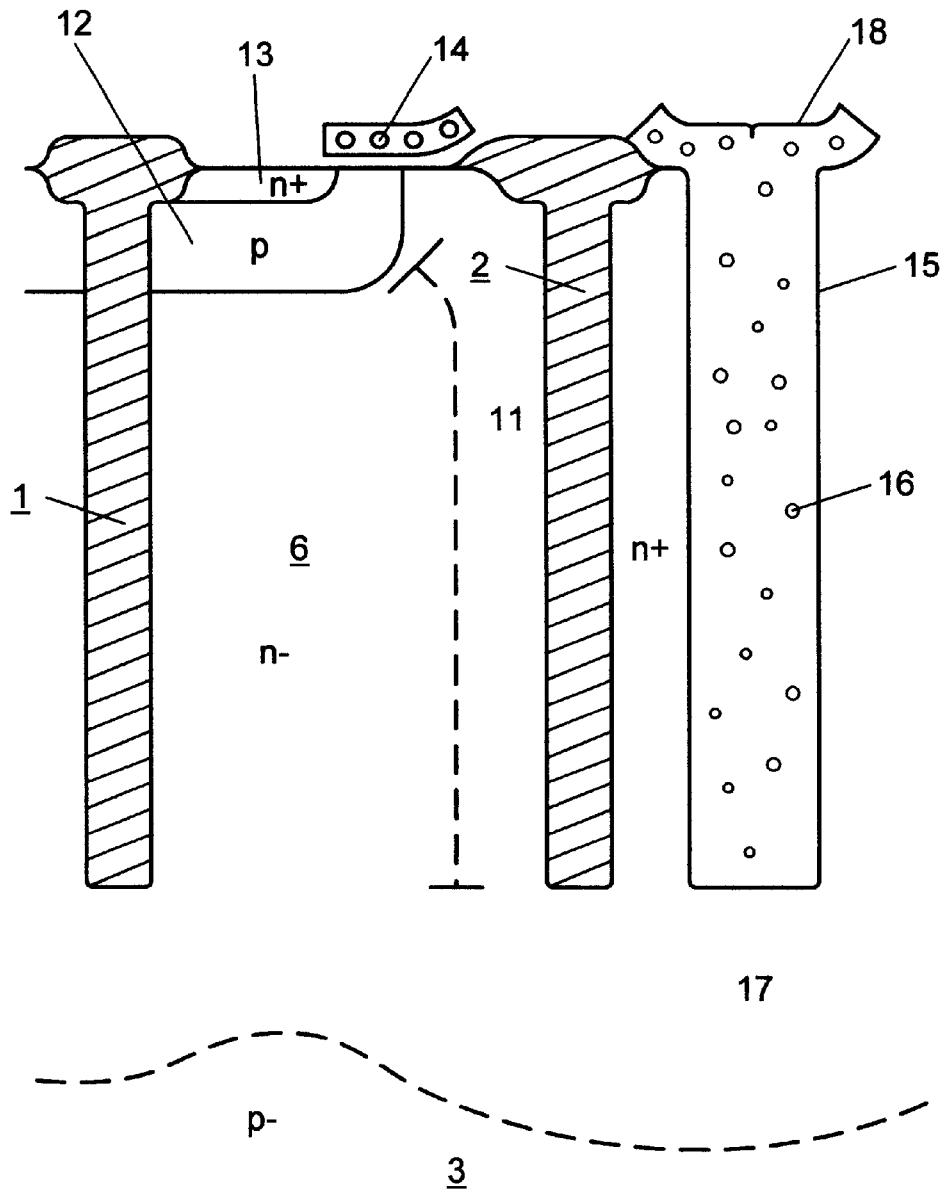
FIG. 4 shows one type of n-channel high voltage transistor.
Figure 5:
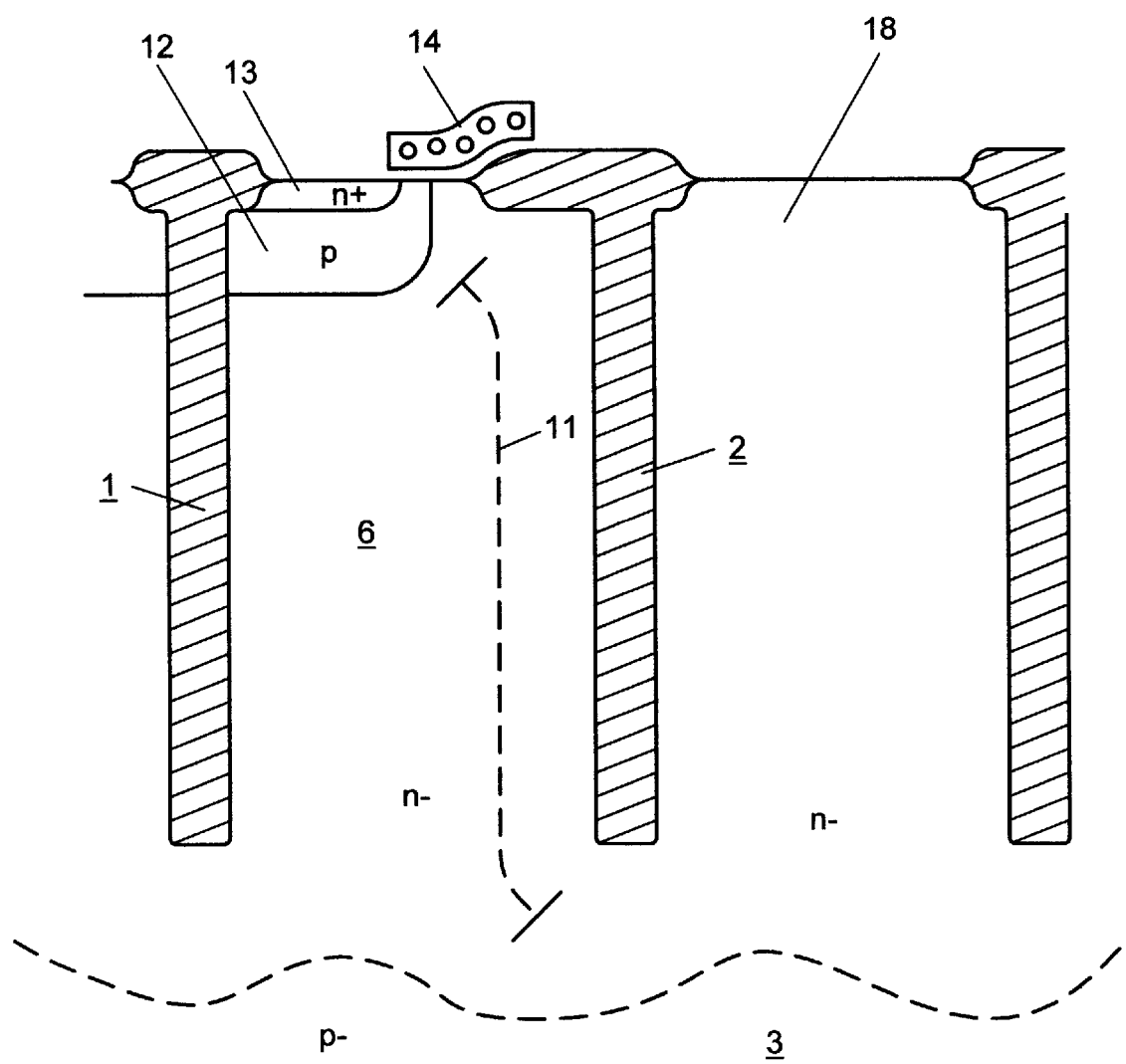
FIG. 5 shows an alternative type of n-channel high voltage transistor.

FIG. 4 shows one type of n-channel high voltage transistor. If the n-concentration 6 is chosen such that the voltage drop of the n-channel transistor occurs along the distance 11, it is possible to build a high voltage transistor with a larger vertical than horizontal dimension by providing the lateral isolation with the oxide filled trenches 2, implanting and diffusing a p-body 12, a source region 13 and patterning a poly-gate 14. Since the drain voltage is established below the bottom 17 of the trenches, it is desired that the drain is contacted 18 by a plug 16 of a well conducting material which is deposited into the broader contact trench 15. An alternative is shown in FIG. 5. If for the sake of process simplicity the deep contacting trench is omitted, a higher drain resistance in the region 18 must be taken into account.

Figure 6:
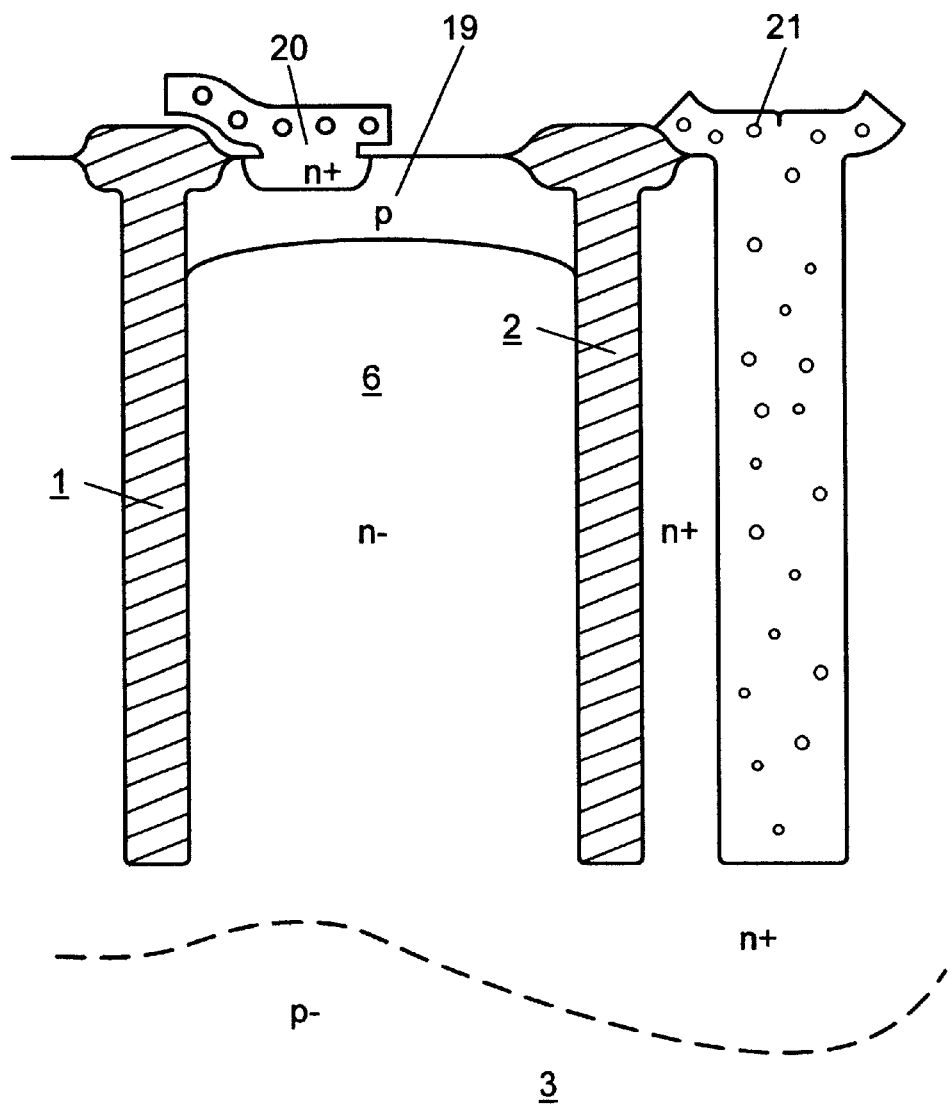
FIG. 6 illustrates a method of realizing a bipolar transistor with vertical base-collector junction.

FIG. 6 shows one out of several possibilities to realize a bipolar transistor with vertical base-collector junction. The depletion layer width needed in the off state of the transistor builds up in the region 6, whereas the lateral isolation is provided by the dielectric 2 and maybe 1. After having manufactured this structure, a base region 19 is formed, and an emitter 20 diffused. The collector is contacted by the highly conductive plug 21.

Figure 7:
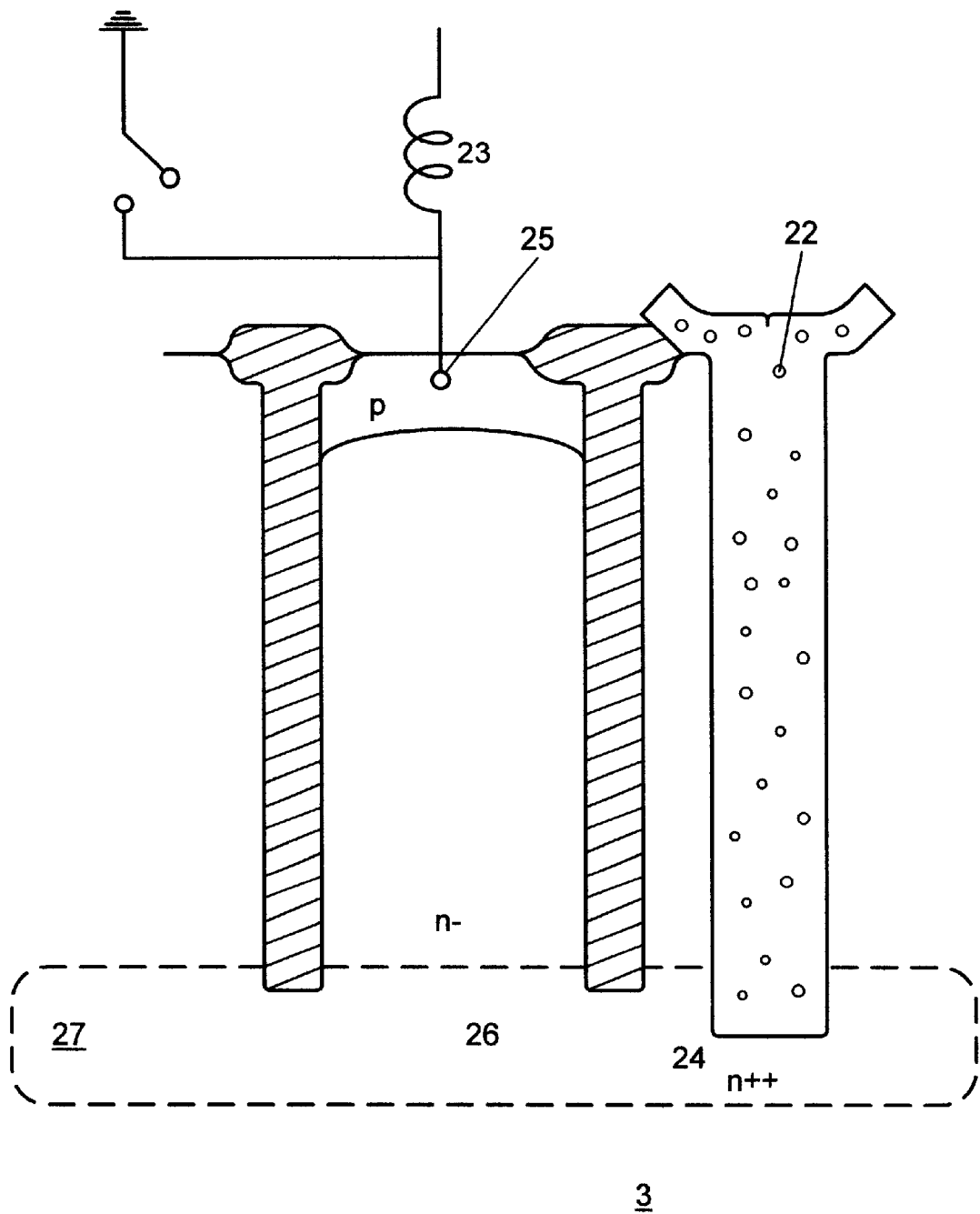
FIG. 7 shows a store which serves to load a certain point in an IC to a high potential.

In FIG. 7 a structure is presented which serves to load a certain point 22 in an IC to a high potential with a well-known inductive method: a current is flowing through an inductance 23 to ground. When the ground is disconnected the potential rises on the point 25 due to Lenz rule until the pn-junction between 25 and 26 becomes positively biased. When the energy which is stored originally in the inductance 23 is dissipated in the shown device, the junction between 25 and 26 becomes negatively biased again, and the point 22 is on a higher potential than it was before. To prevent a parasitic pnp-bipolar transistor between the anode 25 of the diode, the cathode 26 and the p-type substrate, it is necessary to ensure that the diffusion length of the holes coming from 25 is much smaller than the distance between the surface and the lower pn-junction between 26 and substrate. This is possible by providing a heavily doped n-buried layer 24.

Figure 8:
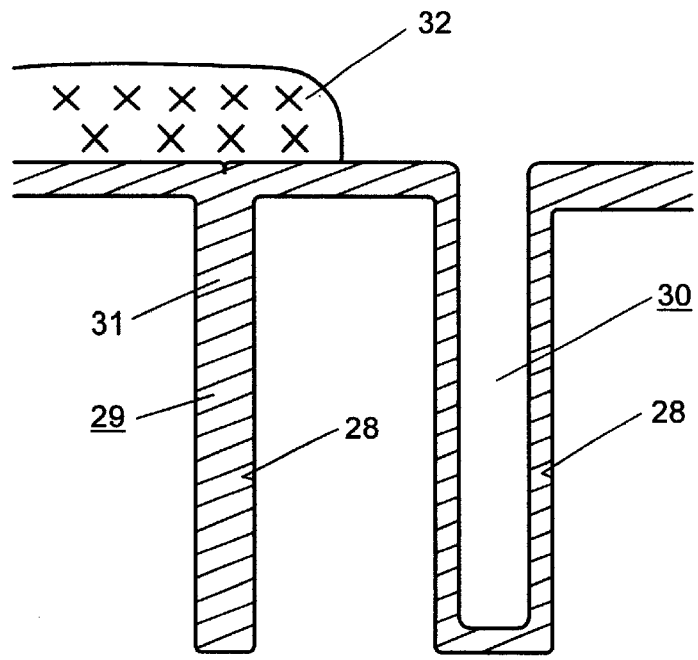
FIG. 8 illustrates a method to open trenches for a subsequent etching process.
Figure 9:
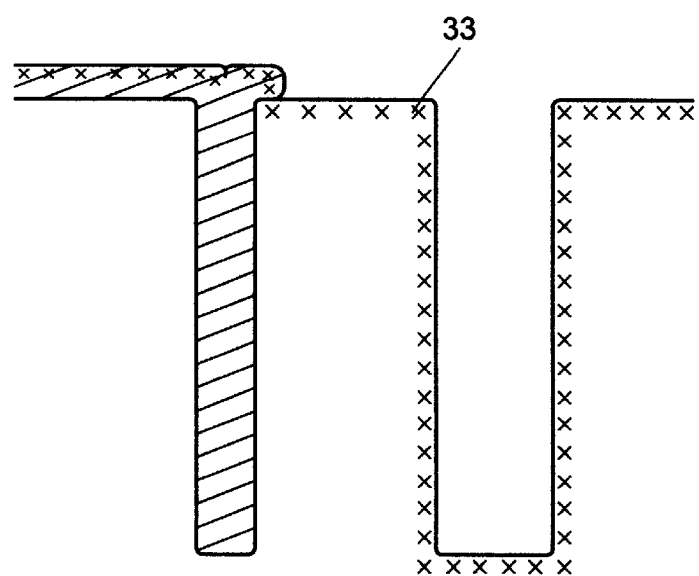
FIG. 9 illustrates a method to obtain a selective doping predeposition in conjunction with FIG. 8.

FIG. 8 illustrates a method to open selectively one or the other of the trenches for a subsequent etching process. A negative photoresist 32 is patterned to open the trench 30, but not 29. Negative resist is chosen since it is not necessary in this case to expose all the resist material till to the bottom of the trench 30. In this manner the deposited oxide 28 can be removed selectively, and also a subsequent selective doping predeposition 33 is achievable, as indicated in FIG. 9.

Figure 10:
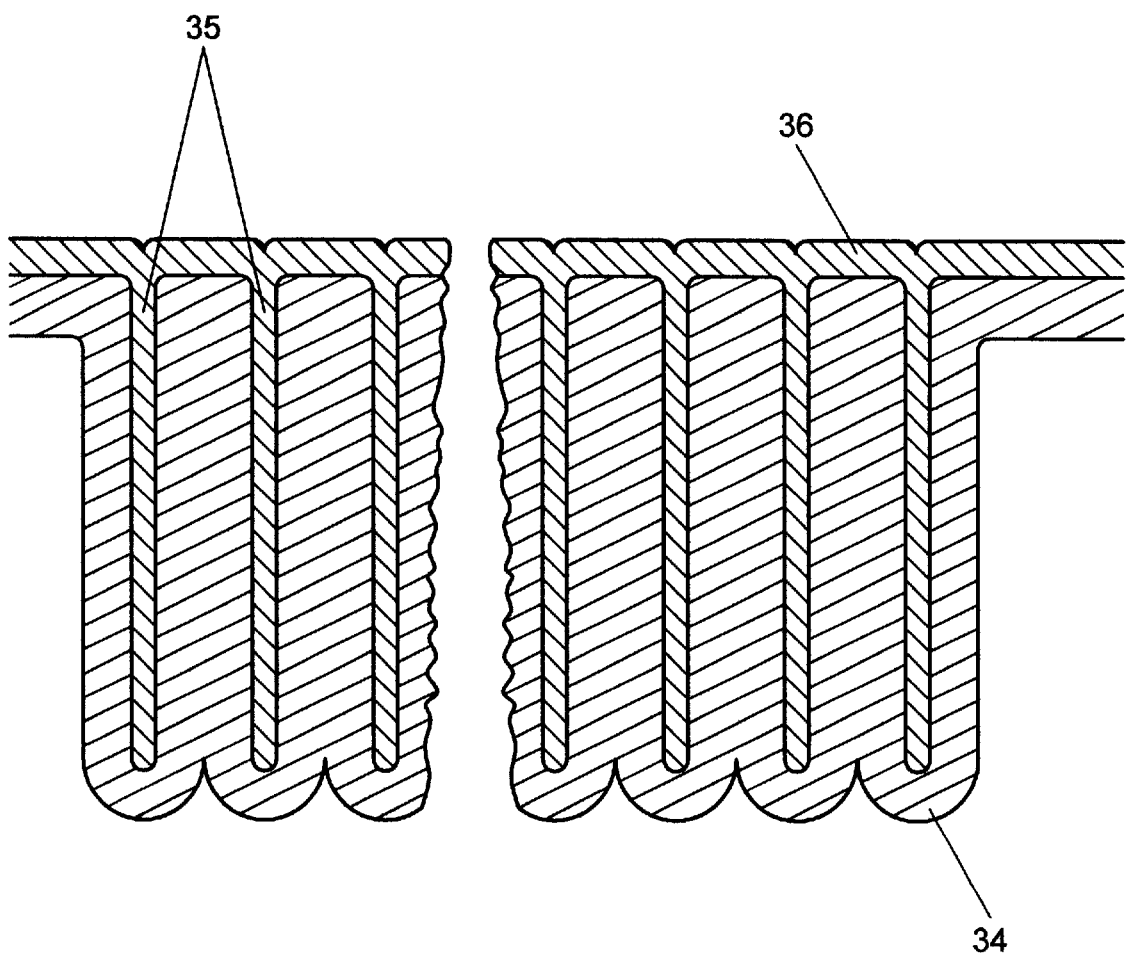
FIG. 10 shows a process for etching a number of trenches separated by a close distance.

Finally FIG. 10 shows a process, where a lot of trenches are etched in very small periodic distance, such that a complete thermal oxidation of the silicon remaining between the trenches is possible, resulting in the thermal oxide 34, and the remaining gap 35 is filled with a suitable CVD oxide 36. Thus with the current state of the art of trench etching equipment an oxide island with a depth of up to 20 μm can be realized which upper surface fits smoothly to the surface of the silicon substrate. Such oxide islands are useful to provide regions on an IC with low parasitic capacitances with respect to the substrate.

The embodiments of the invention in which an exclusive property or privilege is claimed are deed as follows:

1. A method for the production of limited doped regions in a monocrystalline silicon substrate, comprising:
    etching into a silicon substrate at least two neighboring, preferably parallel trenches with a substantially rectangular profile of the vertical cross section, wherein the larger axis of said rectangle is oriented substantially perpendicular to the surface of said substrate,
    subsequently predepositing doping materials at least onto the sidewalls of the trenches,
    subsequently distributing said doping material into the neighboring substrate material of said sidewalls with a high temperature diffusion process, wherein the diffusion of said doping material extends uniformly throughout the whole region in-between the two neighboring trenches, and
    filling at least one trench with isolating material, wherein said isolating material is preferably silicon dioxide.

2. The method as claimed in claim 1, wherein the temperature of said high temperature diffusion process is greater than 1100° C.

3. The method as claimed in claim 1, wherein the isolating material in the trenches is deposited before the diffusion of said doping materials.

4. The method as claimed in claim 1, further comprising filling at least one trench with a conducting material in order to electrically connect a doped layer placed underneath said trench.

5. The method as claimed in claim 1, further comprising
    between the neighbouring and with isolation material filled trenches establishing a counterdoped layer extending over a part of the region in-between the neighbouring trenches, said counterdoped layer serving as a body region for an MOS-transistor or a base region for a bipolar transistor,
    subsequently forming and patterning a gate layer,
    subsequently establishing an even higher doped additional layer serving as a source or emitter regions, and
    establishing a corresponding drain connection outside the region in-between said neighbouring trenches, wherein said drain connection is preferably realized by filling the trenches with conducting material.

6. The method as claimed in claims 1 or 5, further comprising forming a higher doped level underneath said trenches by vertically implanting doping atoms and subsequent diffusion.

7. The method as claimed in claims 1 or 5, wherein the predeposition of the sidewalls of said substantially rectangular trenches is realized by ion implantation with small impact angles, preferably less than 5°.

8. The method as claimed in claims 1 or 5, further comprising establishing the predeposition of said sidewalls with a process selected from one of thermal oxidation in phosphorous- or boron-enriched atmosphere or by phosphorous- or boron containing CVD-layers.

9. The method as claimed in claims 1 or 5, wherein said trenches are formed by anisotropic etch technology.

10. The method as claimed in claim 9, wherein said trenches are formed in an etch gas atmosphere including chlorine and hydrogen-bromide.

11. The method as claimed in claims 1 or 5, wherein said trenches are etched after patterning a hardmask with reactive ion etch, and wherein said hardmask comprises a stack of layers of first a thermal silicon oxide, then a CVD nitride and finally a CVD oxide.

12. The method as claimed in claim 11, wherein the thickness of said thermal silicon oxide is 2 to 100 nm, the thickness of said CVD nitride is 50 to 300 nm and the thickness of said CVD oxide is 500 to 1500 nm.

13. The method as claimed in claims 1 or 5, further comprising depositing a doped polysilicon layer directly onto said sidewalls of said trenches, wherein said doped polysilicon layer serves as the source of dopant atoms.

14. The method as claimed in claims 1 or 5, wherein said trenches are filled at least partly by a CVD oxide which is deposited out of an atmosphere of dichlorsilane (Si2H2C12) and nitrous oxide (N2O).

15. The method as claimed in claims 1 or 5, wherein said trenches are filled at least in part by doped or undoped polysilicon.

16. The method as claimed in claims 1 or 5, further comprising producing a dielectric in said trenches by complete thermal oxidation of the filling material.

17. The method as claimed in claims 1 or 5, further comprising:

in order to achieve different dopings in different trenches, etching said trenches into the substrate with different widths, subsequently filling narrower trenches completely and filling wider trenches in part, subsequently providing a photolithographic mask with negative resist which is opened at the location of the wider trenches, subsequently etching away the filling material, patterned by said negative photolithographic mask, and subsequently performing a dopant predeposition selectively only on said wider trenches.

18. The method as claimed in claims 1 or 5, wherein the doping of the silicon lying in-between said neighbouring trenches includes a complete thermal oxidation, and wherein the then remaining gaps in said trenches are filled with a high temperature CVD-oxide so that the surface then can be planarized.

19. The method as claimed in claims 1 or 5, wherein the perpendicular axis of said substantially rectangular trenches is at least 5 times as long as the axis parallel to the surface of said silicon substrate, and preferably more than 10 times as long.

* * * * *